United States Patent
Sieh et al.

(10) Patent No.: US 7,432,725 B2
(45) Date of Patent: Oct. 7, 2008

(54) ELECTRICAL FIELD SENSORS FOR DETECTING FLUID PRESENCE OR LEVEL

(75) Inventors: Philip J. Sieh, Chandler, AZ (US);
Bradley C. Stewart, Austin, TX (US);
Michael A. Steffen, Rockford, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/376,810

(22) Filed: Mar. 15, 2006

(65) Prior Publication Data
US 2007/0216424 A1    Sep. 20, 2007

(51) Int. Cl.
*G01R 27/26* (2006.01)
*G01F 23/26* (2006.01)

(52) U.S. Cl. ............... 324/662; 324/667; 73/304 C

(58) Field of Classification Search ............ 324/551
See application file for complete search history.

(56) References Cited

U.S. PATENT DOCUMENTS

| | | | | |
|---|---|---|---|---|
| 4,879,508 A * | 11/1989 | Andermo | ............ | 324/690 |
| 4,972,154 A * | 11/1990 | Bechtel et al. | ............ | 324/663 |
| 5,950,487 A | 9/1999 | Maresca | | |
| 6,032,494 A * | 3/2000 | Tanigawa et al. | ............ | 68/12.06 |
| 6,101,873 A * | 8/2000 | Kawakatsu et al. | ............ | 73/304 C |
| 6,212,949 B1 * | 4/2001 | Inder et al. | ............ | 73/304 R |
| 6,337,959 B1 * | 1/2002 | Kwak et al. | ............ | 399/57 |
| 6,420,882 B1 * | 7/2002 | Engebretsen et al. | ............ | 324/667 |
| 6,446,012 B1 * | 9/2002 | Macke et al. | ............ | 702/22 |
| 6,452,514 B1 * | 9/2002 | Philipp | ............ | 341/33 |
| 6,490,920 B1 * | 12/2002 | Netzer | ............ | 73/304 C |
| 6,879,930 B2 * | 4/2005 | Sinclair et al. | ............ | 702/150 |
| 6,922,063 B2 * | 7/2005 | Heger | ............ | 324/658 |
| 2005/0045621 A1 | 3/2005 | Chenier | | |
| 2005/0088416 A1 * | 4/2005 | Hollingsworth | ............ | 345/173 |
| 2006/0242769 A1 * | 11/2006 | Borras et al. | ............ | 8/159 |

FOREIGN PATENT DOCUMENTS

| | | |
|---|---|---|
| GB | 2286247 | 9/1995 |
| WO | WO1997041458 | 11/1997 |

OTHER PUBLICATIONS

International Search Report for correlating PCT Patent Application No. PCT/US 07/62097 dated Feb. 28, 2008.

* cited by examiner

*Primary Examiner*—Vincent Q. Nguyen
*Assistant Examiner*—Jeff Natalini
(74) *Attorney, Agent, or Firm*—Ingrassia, Fisher & Lorenz, P.C.

(57) ABSTRACT

The present disclosure provides several systems. In general, it provides E-field sensor systems that utilize at least one electrode 100 adapted for creating an E-field in an area 210 within a detection volume where fluid presence 400 or presence of a solid body 300 is to be detected. The electrical field sensor is configured to generate a detected signal responsive to a change in capacitance of the electric field, and is communicatively coupled to the electrode 100. In addition, a processor 275 is configured to determine a quantitative measure of a fluid or solid body within the detection volume in accordance with a capacitive relationship with the detection volume. Described are examples of the system for fluid presence detection, fluid level measurement and measurement of proximity to a solid object.

14 Claims, 4 Drawing Sheets

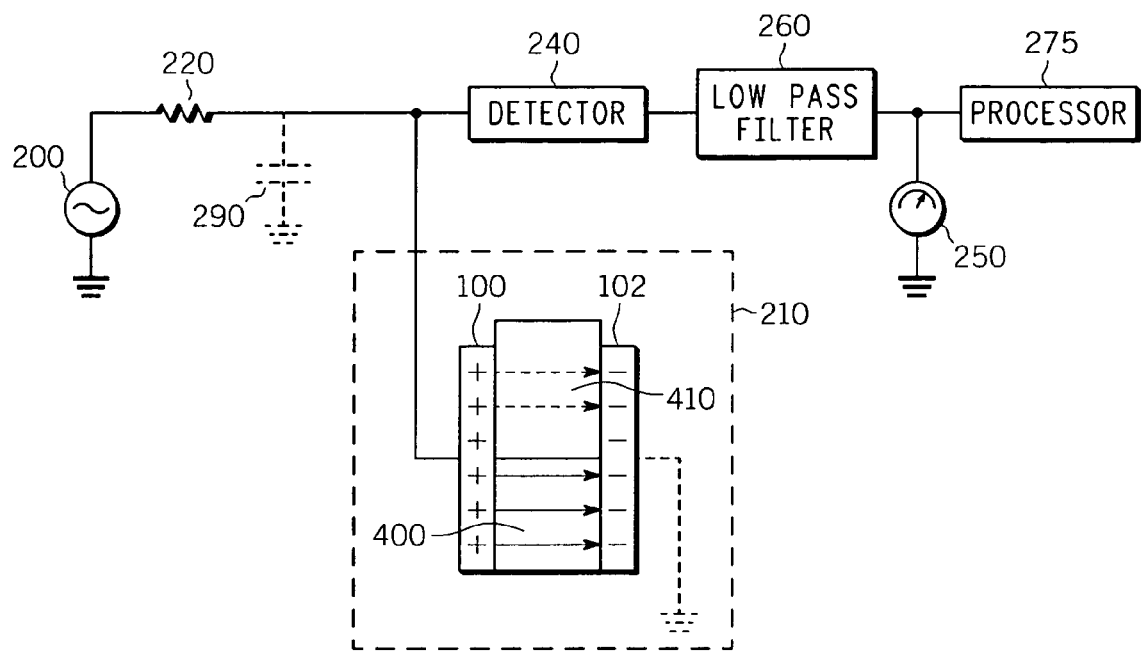
*FIG. 1*
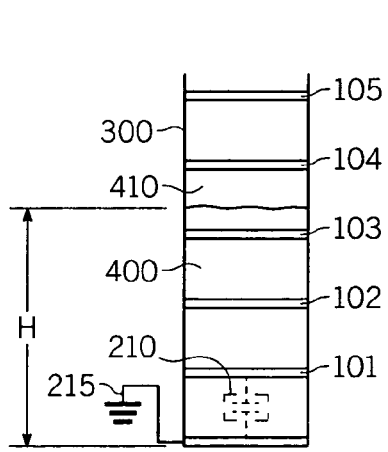 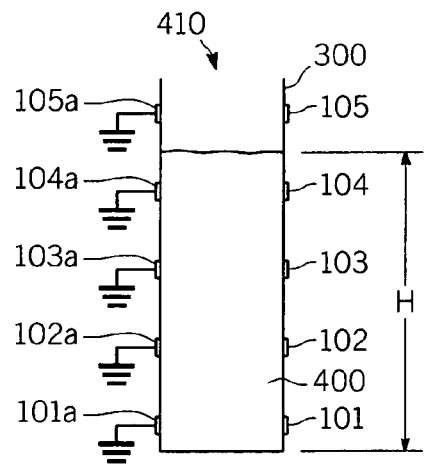
*FIG. 2*  *FIG. 3*

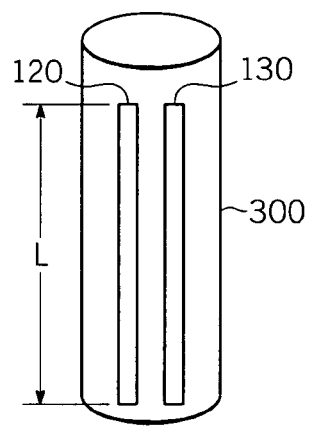
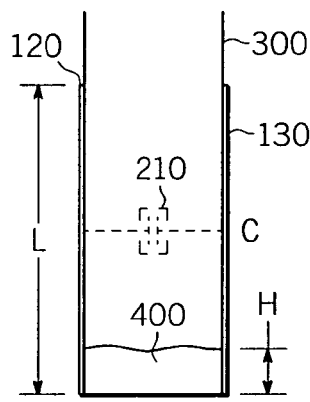
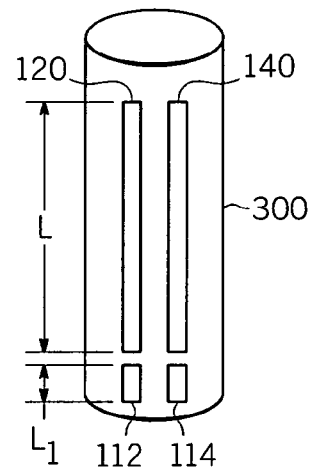
FIG. 4　　　　FIG. 5　　　　FIG. 6
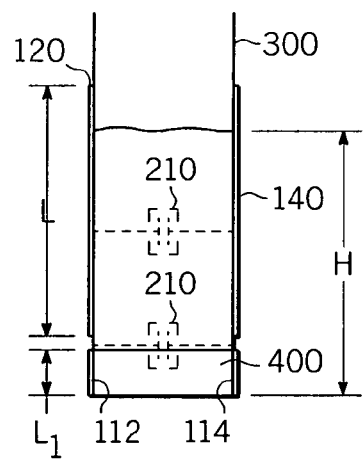
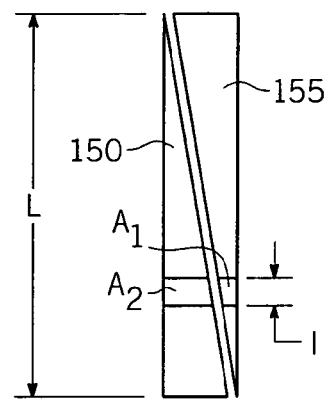
FIG. 7　　　　FIG. 8

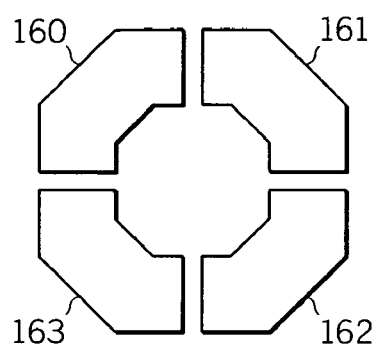
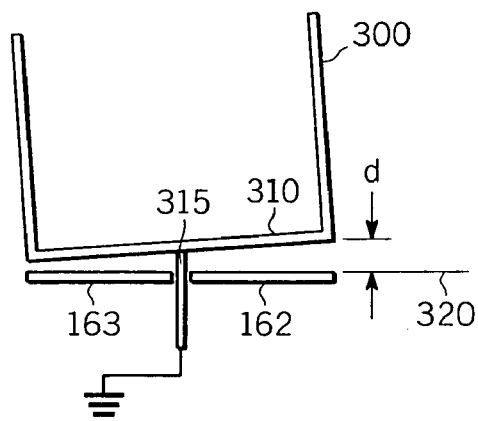
*FIG. 11*                *FIG. 12*
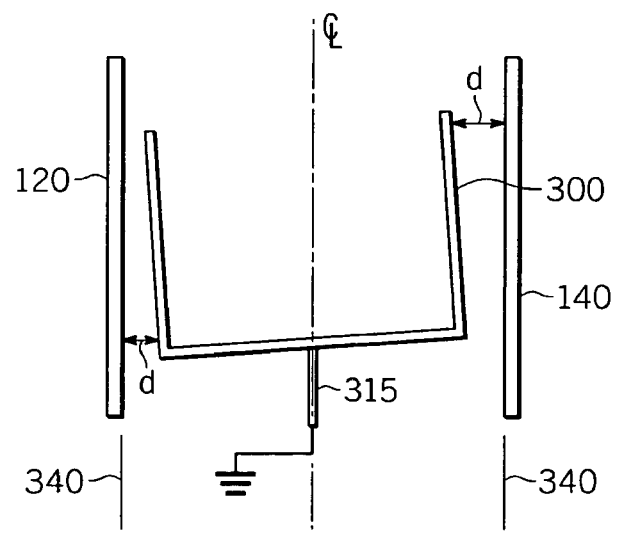
*FIG. 13*

ELECTRICAL FIELD SENSORS FOR DETECTING FLUID PRESENCE OR LEVEL

TECHNICAL FIELD

The present disclosure relates generally to the area of sensors for detection and control, and more particularly, the present disclosure relates to electric field sensors.

BACKGROUND

Fluids, both liquids and gasses, are often stored or contained in a variety of applications, in industrial and consumer settings. For example, in industry, large amounts of liquids are stored in process technologies that produce goods ranging from petro-chemicals, to foods, pharmaceuticals, and corrosive chemicals, such as concentrated acids or alkalis. In the consumer area, liquid levels are maintained in laundry washing machines, liquefied propane tanks (for heating or cooking), water heaters, and other applications.

In general, most fluid level detectors are in contact with the fluid(s). While this is not a significant issue in many instances, in other cases it poses challenges. For example, the fluid might be corrosive (such as concentrated sulfuric acid) or might otherwise interfere with the detector.

Corrosion is also an issue in laundry automatic washing machines that use highly alkaline cleaning compositions. It is desirable to control liquid levels in these machines to minimize energy and water usage. However, detergents and additives create conditions (like foaming) that pose difficulties in the detection of water level. In addition, when the machine is in a spin cycle to dry clothing by centrifugal force, the machine may vibrate violently if its contents are not evenly distributed within the drum of the machine. Such a maldistributed spin cycle load is referred to as an "unbalanced load."

Accordingly, it is desirable to develop a system for detecting fluid level that is not in direct physical contact with the fluid but rather relies upon an intrinsic physical property of the fluid. This reduces any potential for system component damage from the fluid and resultant malfunction. In addition, in industrial applications especially, this may have a significant advantage. It may eliminate lost capacity resulting from shutting down continuous processes for removal of process fluid-damaged detectors and repair. In addition, it is desirable to develop a system that is useful in a wide range of applications and that may even be adaptable, in principle, to detect an unbalanced load in a laundry drum to permit corrective action. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present disclosure may be derived by referring to the detailed description and claims when considered in conjunction with the following figures. The figures are schematic, may contain concept elements for illustrative purposes that are not physically present, and are not to scale. In the figures, like reference numbers refer to similar elements. In this disclosure, the figures are representational and include information that is not physically present, such as conceptual capacitor 210 which is shown in broken lines to illustrate a principle. Further cross sectional views are not to be construed as mechanically true but may be partial cross sections with detail added that might not appear in true cross sections to facilitate illustration of principles of the disclosure.

FIG. 1 is a diagram depicting an E-field sensor, in simplified form, in accordance with the present disclosure;

FIG. 2 is a schematic cross sectional side view of an embodiment of the present disclosure using a series of ring electrodes;

FIG. 3 is a schematic cross sectional view of an embodiment of the present disclosure using a series of strip electrodes;

FIG. 4 is a schematic side view of an embodiment of the present disclosure using a pair of continuous electrodes;

FIG. 5 is a schematic cross sectional view of FIG. 4;

FIG. 6 is a schematic illustrating a proportioning method that eliminates deviations caused by changes to measured fluid properties, according to the present disclosure;

FIG. 7 is a schematic cross sectional view of FIG. 6;

FIG. 8 is a schematic illustration of a pair of gradient electrodes, in accordance with the present disclosure;

FIG. 11 is a top view of a four-electrode ring in accordance with an embodiment of the present disclosure;

FIG. 12 is a schematic side view of a drum orientation being detected by the electrodes of the embodiment of FIG. 11; and FIG. 13 is a schematic side view of a drum orientation being detected by electrodes arrayed around the circumference of a drum, and aligned parallel to an axis of rotation of the drum.

DETAILED DESCRIPTION

Figure 9:
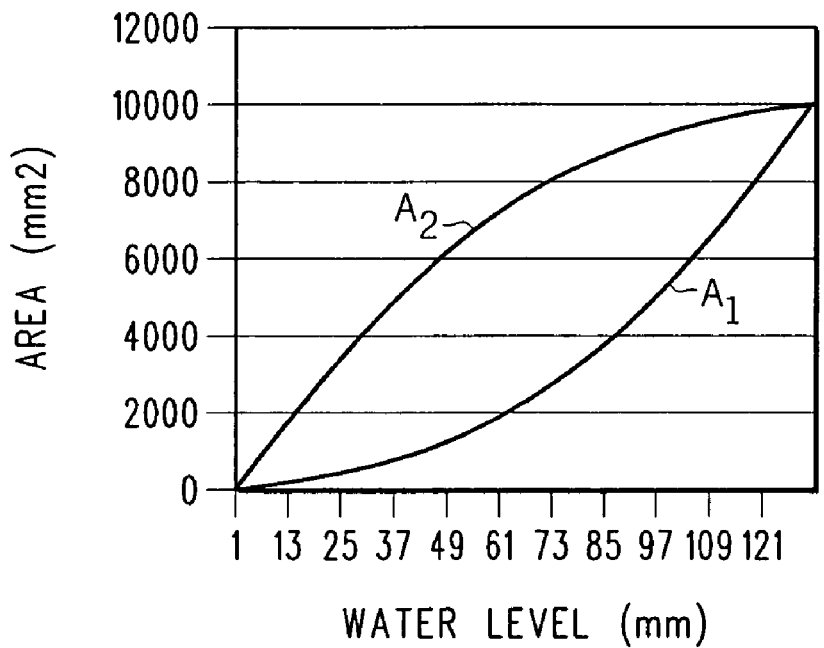
FIG. 9 is a graph depicting electrode area (A) versus liquid level.

The following detailed description is merely illustrative in nature and is not intended to limit the present disclosure and its uses. Furthermore, there is no intention to be bound by any expressed or implied theory presented in the preceding technical field, background, brief summary or the following detailed description.

As a preliminary matter, the terms "first," "second," and the like in the description and in the claims, if any, are used for distinguishing between similar elements and not necessarily for describing a particular sequential or chronological order. It is to be understood that the terms so used are interchangeable under appropriate circumstances such that the described embodiments of the present disclosure are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

Further, the terms "left," "right," "front," "back," "top," "bottom," "over," "under," in the description and in the claims, if any, are used for descriptive purposes and not necessarily for describing permanent relative positions. It is to be understood that the terms so used are interchangeable under appropriate circumstances such that the embodiments of the present disclosure described herein are, for example, capable of operation in other orientations than those illustrated or otherwise described herein.

The present disclosure provides electrical field ("E-field") sensors and systems using these sensors to sense presence of fluids, sense fluid level or interface between fluids having different dielectric constants, and to sense the proximity of a body in an E-field to electrodes. The term "fluid" is used herein in the sense of a material that flows, such as liquid, gasses, and liquefied gasses.

The sensors and systems are not in physical contact with the fluid being sensed, or the body being sensed. Instead, the sensors include electrodes that generate an E-field and detectors that detect changes in the E-field caused by presence of the fluid, interface of the fluid or proximity of a body to the electrodes. The lack of required physical contact with fluid or object is an advantage in several situations. For example, where corrosive liquids are involved, or liquids that cause fouling of apparatus, or fluids that are flammable (pressurized, liquefied gasses, for example) and must be kept away from potential sources of ignition.

The E-field systems of the present disclosure will find wide ranging applications. For example, in the consumer large appliances area the systems may be used to sense and control liquid level in an automated laundry washing machine and also to sense and permit control of unbalanced loads in the machine during a spin drying cycle. The system may be adapted to take into account changes in water dielectric constant as detergents and other chemicals are added, and may also be adapted to take into account a level of foam created by detergent action at the water-air interface.

The present disclosure provides several systems. In general, it provides E-field sensor systems that utilize at least one electrode adapted for creating an E-field in an area within a detection volume where fluid presence or presence of a solid body is to be detected. An electrical field sensor is configured to generate a detected signal responsive to a change in the electric field. The field sensor, which may be an integrated circuit, is communicatively coupled to the electrode. In addition, a processor is coupled to the field sensor. The processor is configured to utilize sensor-generated signals in a determination of a quantitative measure of a fluid or solid body within the detection volume, in accordance with a capacitive relationship with the detection volume.

One system of the present disclosure, for example, includes a plurality of discrete electrodes. Another system includes a pair of continuous strip electrodes. In yet another, there is a pair of "complementary electrodes" exemplified by, but not limited to, triangular electrodes. Each of the exemplified systems and modifications of these provides unique advantages, as explained in more detail below, and consideration of these should dictate which system is most suited to any particular application.

In order to better appreciate the technology of the present disclosure, consider that the object (liquid, body or gas) to be detected forms a capacitor to a virtual ground. Thus, a model of the capacitor includes a pair of spaced-apart opposite electrodes with the object between the plates. Accordingly, the following equation applies:

$$C = [k \epsilon_0 A / d]$$

where C is detected object capacitance, k is a dielectric constant of object to be detected, d is a characteristic dimension of the system (such as the distance between electrodes or from electrode to a grounding plate or from electrode to a solid object), $\epsilon_0$ is the permittivity constant (for free space=$8.854 \times 10^{-12}$ Farad/meter$^2$), and A is the affected electrode surface area.

If, for example, the object to be detected is water level in a vertical washing machine drum using two opposed electrodes on the drum side, for example, then k is known, $\epsilon_0$ is the permittivity of free space, and d is the known distance between the electrodes. The affected electrode area A is the area that faces water and extends up to the water level. This affected area A will vary as the water level H changes, and this will translate into a change in capacitance C that is measurable. At the outset, with no water present, capacitance may be measured. Capacitance C will change as soon as water is introduced. If the electrode is set up to detect when water reaches a certain level along a length L of the vertical electrode (or to a height H in a container to which the electrode is attached), the water level may be tracked by monitoring changes in capacitance C, until capacitance C reaches a value corresponding to the water level of interest.

FIG. 1 provides a schematic of some of the concepts involved in systems of the present disclosure that use E-field perturbation as a basis for sensing. The system depicts a simple E-field sensor array, and is merely exemplary. Other types of sensing systems may also be used according to the present disclosure. In the concept diagram of FIG. 1, the circuit of interest includes an electrode 100, for example any one of the electrodes shown in other FIGS. herein, with either an opposite electrode 102 or a ground plate 102; a signal generator 200, for example a 120 Khz sine wave generator; a load resistor 220, for example a 22 K Ohm resistor; a detector 240; low pass filter 260; a processor 275, for example any suitable processor that can be configured to perform necessary calculations; and an indicator 250. The electrode 100 and opposed electrode or ground plate 102 together with material between these, such as water 400 and air 410 in this example, form a "conceptual capacitor" 210. Of course, the conceptual capacitor is not limited to air and water, and other materials and fluids may also be present in the same concept. The capacitance of capacitor 210 varies with variation in the relative amounts of its contents, water 400 and air 410, in this case. A signal generated will be altered by any changes at the electrode 100. Thus, the detector 240 in this example monitors the amplitude of the sine wave and is able to detect changes. The low pass filter 260 removes any extraneous AC frequency components from the incoming signal. The processor 275 calculates a quantitative measure of the fluid, for example, presence of fluid, liquid level, or the proximity of a solid body. The indicator 250 displays information about the fluid or body to be detected, for example water presence 400 (as opposed to air 410), water level H, or change in proximity of a body to the electrode.

FIG. 2 is a schematic cross sectional view of a container 300 that is oriented vertically and being filled with a liquid, such as water 400. Of course, the container may be oriented other than vertical, as for example in a horizontal front loading laundry washing machine, or at an angle between vertical and horizontal, as long as electrodes are placed to sense changes in water level. Here, for the vertical container 300, the discrete electrodes 101-105 are equidistantly spaced apart rings arrayed vertically along the outside of the container 300. As explained above, the adjacent electrodes 101-105 that extend at least partially around a container (or a stand pipe that is communication with liquid in container 300) and space between electrodes may be viewed as a capacitor 210, for electrical circuit modeling purposes, as illustrated in this schematic, between electrode 101 and ground 215.

Assuming the fluid 400 in the container 300 is water, the water level H rises as the container is filled. Thus, if the electrodes 101-105 are in communication with a sensor array such as the example shown in simplified form in FIG. 1, signal output from the circuit will change as the water level reaches an electrode that is being monitored. The moment the change is detected, it indicates that the water level H has reached the location (e.g. elevation) of the electrode being monitored, which is known. Knowing electrode location and container dimensions, the quantity of water is readily calculated. The indication of water height and container dimensions may be used to control water input, for example by controlling a water input control valve to change rate of water supply or to shut off water supply. In addition, based on water height determined, an alert may be triggered, such as an audio and/or visual alert. If water continues to flow into container 300, the water height will not be precisely known as it rises between adjacent electrodes until the water level reaches the next electrode resulting in detection of output signal change from that electrode.

This system requires a series of electrodes, and fluid detection takes place when the fluid reaches an electrode. Of course, the system may be fitted with a timer so that when the fluid reaches the first electrode, the rate of fluid inflow may be estimated by a simple program using time and known container dimensions. The estimated flow rate may be used to estimate where the fluid level might be expected to be at any time, until its level is confirmed by capacitance change when the level reaches the next electrode. Accordingly, the system potentially could provide an estimated or actual liquid level at any time. The spacing of the electrodes and number of these can also be varied depending upon required accuracy of fluid level estimation.

FIG. 3 depicts a series of discrete strip electrodes 101-105 mounted at equal spaced intervals vertically along one side of container 300. Ground plates 101a-105a corresponding to each electrode and are mounted on the opposite side of the container. Measurement of water height proceeds in much the same manner as described with respect to FIG. 2. A conceptual capacitor is formed between each electrode-ground plate pair so that measured capacitance indicates at which pair, or between which adjacent pairs, the water level H is located.

FIGS. 4 and 5 are schematics showing continuous electrode strips 120, 140 of length L on the outside of a container 300. The strips shown are substantially rectangular, being long and narrow. They are arrayed on the outside wall of the container 300 and extend over the region within which liquid height H is to be sensed and controlled. Because the strips are continuous, the portion of the area of the electrodes that faces the liquid ("the affected area") will vary as the liquid level H changes. Accordingly, affected electrode area A is a variable in the capacitor equation: $C=[k\epsilon_0 A/d]$. As liquid level increases, A increases, and C increases, but k, d and $\epsilon_0$ remain constant. Consequently, a graph of C (measured) versus A (measured) may be expected to show a substantially linear relationship. Since the affected electrode area A is related to the affected length of the electrode (the length that faces water) and since this affected length L can be correlated to H, the liquid level, the liquid height H can be calculated from a measured capacitance C. A suitably configured processor can calculate and report liquid height routinely and continuously or at preset intervals based on a predetermined relationship between capacitance, affected electrode area and liquid height.

Of course, in certain circumstances the dielectric constant of the fluid might not be constant. For example, in a washing machine, detergent and additives may change the dielectric constant of water, leading to misleading water level output. FIGS. 6 and 7 present a solution to this issue. Here, a pair of reference electrodes 112, 114 is added near the base of container 300. These electrodes 112, 114 each have length $L_1$ and they measure capacitance $C_1$ when the liquid level H has reached them, as shown in FIG. 7. The continuous strip electrodes 120, 140 each have length L. Since the area $A_1$ of the reference electrodes 112, 114 is invariant (they are "under the water level" when the system is in use), their measured capacitance $C_1$ varies in direct proportion to changing dielectric constant k. Thus, they can be used as a reference value to estimate the total water height in the container. A simple proportion may be applied:

$$[C_1/C_2 = L_1/L]$$

Where $C_1$ is the capacitance at electrodes 112, 114; $C_2$ is capacitance at electrodes 120, 140; $L_1$ is known length of reference electrodes 112, 114; and L is the variable length of electrodes 120, 140 facing the water level.

Using this technique, the liquid level can be determined without regard to changes in dielectric constant as long as any changes are uniform throughout the liquid body—in other words, as long as there is no significant difference in liquid dielectric constant near the reference electrodes as compared to liquid adjacent the continuous electrodes. Appropriate location of the reference electrodes relative to each other and to the continuous electrodes minimizes potential error.

As an alternative to rectangular electrodes, the present disclosure also provides electrodes of "complementary shape". These electrodes are shaped so that when placed adjacent each other, the sum of the areas of any equal sized segments ("complementary segments") along the electrodes produces the same total area. Thus if $A_1$ is the area of the first electrode portion of the segment and $A_2$ is the area of the second electrode portion of the segment, $A_1+A_2$=stant. This is illustrated as an example in FIG. 8, a schematic of a matched pair of gradient electrodes 150, 155. These electrodes are of complementary shape: in this case they are elongate and shaped as right-angled triangles. When the slanted side (hypotenuse) of each triangular electrode is placed adjacent each other, with apexes of the triangles at opposite ends, the electrodes together form a rectangle. Any segments of equal length, shown here as having length 1, taken anywhere along the length L of the electrodes will have the same constant total area comprised of the sum of $A_1+A_2$ but the relative proportion of $A_1$ and $A_2$ may vary in size from segment to segment. Electrodes other than triangular electrode but with the same complementary shape characteristic will also be useful in the disclosed technology. Of course, the complementary shape is not dependent on forming a rectangle, as in the case of the triangular electrodes, as long as the electrodes together form a shape that has equal area segments (taken from equal length segments).

Figure 10:
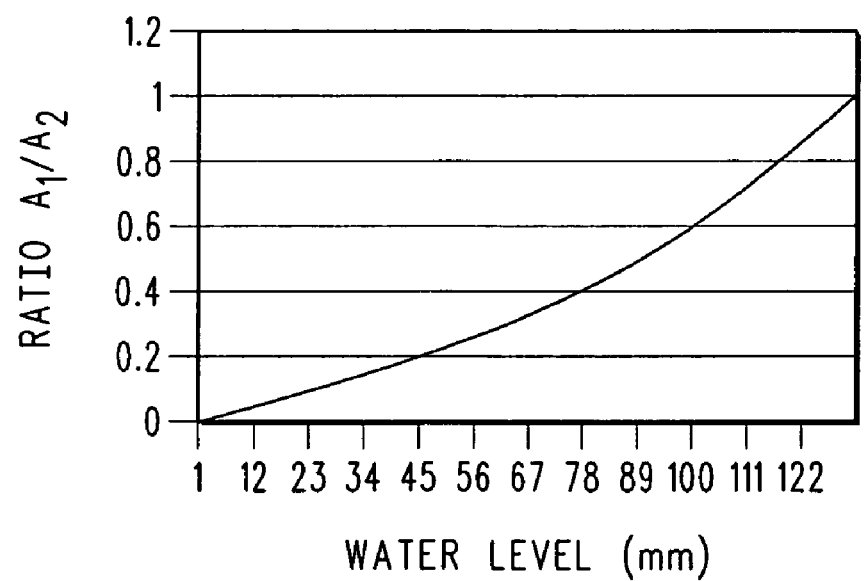
FIG. 10 is a graph depicting liquid height (H) versus the ratio of areas of two gradient electrodes ($A_1/A_2$)

If the illustrated gradient electrodes 150, 155 of FIG. 8 were applied to the container 300 of FIG. 5, different sized areas of each will be interfacing with a changing liquid level. The ratio $A_1/A_2$ between the affected areas $A_1$ and $A_2$ (e.g. the area of each electrode facing a liquid rising in a container) will vary traversing the electrode pair from top to bottom. Based on geometry, the ratio of the affected areas $A_1$ and $A_2$ of each triangular electrode changes in a predetermined way as liquid height H changes. This is shown graphically in FIG. 9. This change in area ratio affects the measured capacitance C. Further, the relationship between this area ratio (which correlates with liquid height H) with respect to capacitance C may be graphed (see FIG. 10 for example) or compiled into a look up table or characterized by a polynomial fit equation. Thus, there is an available correlation between affected area ratio and measured capacitance. Since affected area ratio correlates to affected length L of the electrodes, and this correlates to liquid height, the system readily matches a liquid height H to any measured capacitance. (Liquid height H is typically offset from affected electrode length L by a known amount.)

The use of gradient electrodes in a system to detect liquid level has proven to be relatively independent of such factors as foaming of the liquid that might otherwise interfere with level detection. In addition, reference electrodes may be used in conjunction with gradient electrodes, as in the case of the continuous strip electrodes described above.

The foregoing descriptions focus mainly on fluids, and mainly liquids. However, the systems of the disclosure may also be applied to solid bodies that are sufficiently electrically conductive to interfere with an E-field, such as a stack of coins, for example. For example, FIG. 11 depicts four electrode pads 160-163 aligned in a horizontal plane and arrayed around a circumference of a circle. Of course, other electrode shapes may also be useful, such as "wedge"—shaped electrodes, for example. These electrodes may be included in a planar base structure 320 beneath a container 300. The container 300 may be for example a vertical drum 300 of an automatic laundry washing machine that rotates about a central axis 315 and that is shown here to be electrically grounded. When the drum 300 is precisely vertical, it will rotate so that any point on its flat base 310 is, at any time, the same vertical displacement d above the electrode pads 160-163. If the drum is unbalanced however, perhaps due to maldistributed laundry load, it will not only rotate but wag from side to side as the laundry load mass distribution dictates. This wagging motion disturbs the equidistant spacing from the electrodes and plane 320. The wagging motion causes the machine to vibrate violently and may even cause it to "walk" across the floor. In extreme cases, damage may result. According to the present disclosure, the electrode pads 160-163 will detect the proximity d of the drum base 310 to each of the electrodes by applying the capacitance equation where the characteristic measurement (distance) d is the variable (A is constant, as is the dielectric constant k, and permittivity $\epsilon_0$). Accordingly, a change in proximity d of drum base 310 to electrode plane 320 translates to a variation in capacitance C. Because the variations are detectable, they may be used as a control factor to take appropriate corrective action. For example, in the case of a laundry drum, to generate an alarm, to shut down the motor spinning the drum, or to correct the load imbalance. Benefits in the case of laundry applications include more efficient spin cycles to remove water (saving heater energy usage) and extended life for the transmission and bearings.

FIG. 13 is another embodiment, in this case an array of a plurality of electrodes (of which only two are shown as 120, 140, as an example) surround an outer surface of a drum 300. The array of electrodes includes a plurality of electrodes spaced around the circumference of the drum 300 in a circular array of diameter 340-340. The electrodes are each aligned to be parallel with the central axis of a vertical or horizontal drum 300 that passes through axis of rotation 315. The electrode array creates an E-field that senses change of characteristic dimension d, the distance from the outer surface of the drum 300 to the nearest electrode of the array of electrodes. Thus, if the drum 300 wags while rotating about its central axis, the distance d varies and sensors will detect the variation in E-field.

In summary, the present disclosure provides a variety of benefits, and the technology is widely applicable. While examples specific to laundry washing machines have been used to illustrate aspects of the technology, the E-field sensors and systems are flexible and widely applicable.

The present disclosure provides an E-field sensor system that includes: a first electrode adapted for creating an E-field in an area within a detection volume where fluid presence or level is to be detected. The system has a ground plate or a second electrode opposite the first electrode. In addition it has an electrical field sensor, communicatively coupled to the first electrode, that is configured to generate a detected signal responsive to a change in the electric field. A processor, coupled to the field sensor, is configured to determine a quantitative measure of a fluid within the detection volume from the detected signal in accordance with a capacitive relationship between the first electrode, the detection volume and fluid properties. In one embodiment, the first electrode may include a first series of discrete electrodes where the discrete electrodes are arrayed to each create an E-field in an area in a vicinity of the electrode. The capacitive relationship may include the relationship:

$$C=[k\epsilon_0 A/d]$$

where C is capacitance, k is a dielectric constant of fluid to be detected, d is a characteristic dimension, $\epsilon_0$ is the permittivity of free space, and A is an electrode surface area.

The first electrode may alternatively include a first continuous strip or a series of ring electrodes or a series of strip electrodes. In one instance the first electrode may be a substantially uniformly rectangular strip, and the ground plate or second electrode may have dimensions substantially identical to the first electrode. In this instance, the capacitive relationship may also include:

$$C=[k\epsilon_0 A/d]$$

where C is detected capacitance, k is a dielectric constant of a fluid to be detected, d is a characteristic dimension, $\epsilon_0$ is the permittivity of free space, and A is an electrode surface area.

The system with the continuous strip first electrode may alternatively in addition include a pair of reference electrodes. The processor may then be further configured to determine a quantitative measure of fluid by including dimensional and capacitive relationships between the first electrode and the reference electrodes.

The E-filed sensor system may alternatively have a first electrode and a second electrode of complementary shape such that any equal length complementary segments have a constant area. In this case, the capacitive relationship may include:

$$C=[k\epsilon_0 A/d]$$

where C is detected capacitance, k is a dielectric constant of a fluid to be detected, d is a distance between the electrodes, $\epsilon_0$ is the permittivity of free space, and A is an electrode surface area. Further, inputs to the processor may include a relationship between fluid quantitative measure, capacitance and a ratio of an area $A_1$ of the first electrode to an area $A_2$ of the second electrode.

In another aspect, the present disclosure provides an E-field sensor system including: a series of discrete first electrodes, each adapted for creating an E-field within a local detection volume where fluid presence or level is to be detected; an electrical field sensor communicatively coupled to the first electrodes where the electrical field sensor is configured to generate a detected signal responsive to a change in the electric field; and a processor coupled to the electrical field sensor. The processor is configured to determine a quantitative measure of a fluid within a local detection volume from the detected signal in accordance with a predetermined capacitive relationship between the first electrode, the detection volume, and the fluid.

The system may further include an analog signal generator, an analog signal detector, and a digital converter receiving input from the detector. The converter in turn supplies digital output as input to the processor. Further, the processor may include a dedicated input port for digitally converted signals from each of the respective electrodes. In addition, the system may include means for generating an alert. In another embodiment the system may have a series of second electrodes opposite the first series.

In yet another aspect, the present disclosure provides a sensor system including: a first electrode and a second electrode adapted to create an E-field within a detection volume. An electrical field sensor is communicatively coupled to the first and second electrodes and is configured to generate a detected signal responsive to a change in the electric field. A processor is coupled to the electrical field sensor and is configured to determine a quantitative measure of a fluid within the detection volume from the detected signal in accordance with a predetermined capacitive relationship between the first electrode, the second electrode, the detection volume, and the fluid. The electrodes may be rectangular strips. The system may include a reference electrode located to sense fluid continuously while the system is in use. In this instance, the processor is further configured to determine a quantitative measure of fluid by including a dimensional and capacitive relationship between the first electrode and the reference electrode. As an alternative to rectangular strips, the first electrode may be a triangular strip and the second electrode may be a complementary triangular strip, such that such that summing equal length complementary segments of the electrodes provides a constant area. In this instance, the processor is further configured to determine a quantitative measure of fluid by including a relationship between fluid quantitative measure and a ratio of area $A_1$ of the first electrode to area $A_2$ of the second electrode.

The present disclosure also provides an E-field sensor system for detecting proximity of an object. The system includes an array of electrodes aligned in a plane parallel to a characteristic surface of an object. The electrodes are adapted to create an electric field within a detection volume. An electrical field sensor is communicatively coupled to the electrodes and is configured to generate a signal responsive to a change in the electric field. A processor is coupled to the electrical field sensor and is configured to determine a displacement measure of a body within the detection volume from the signal in accordance with a predetermined capacitive relationship between the electrodes, the detection volume, and the body. The capacitive relationship may include:

$$C=[k\epsilon_0 A/d]$$

where C is detected capacitance, k is a dielectric constant of an object to be detected, $\epsilon_0$ is the permittivity of free space, and A is an electrode surface area, and d is a characteristic displacement dimension.

The dimension d may be a distance from an electrode in the array to a nearest point on a surface of the object. The characteristic surface may be a portion of an outer surface of an object. The object may be a vertical drum of a laundry washing machine. The object may be a horizontal drum of a front loading washing machine. And, the array may include a grid of electrodes in a plane parallel to a base of the drum. Alternatively the array is aligned in a plane parallel to an axis of rotation of the drum, and the characteristic surface is an outer cylindrical surface of the drum.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An electric field sensor system comprising:
   a first electrode adapted for creating an electric field in an area within a detection volume where fluid presence or level is to be detected;
   a second electrode communicatively coupled to the first electrode;
   a reference electrode;
   an electrical field sensor communicatively coupled to the first electrode and to the reference electrode, the electrical field sensor configured to generate a detected signal responsive to a change in the electric field; and
   a processor coupled to the field sensor, the processor configured to determine: (i) the dielectric constant of a fluid within the detection volume utilizing the reference electrode, and (ii) a quantitative measure of the fluid within the detection volume from the dielectric constant and the detected signal in accordance with a capacitive relationship between the first electrode, the detection volume and fluid properties.

2. The system of claim 1, wherein the first electrode comprises a first series of discrete electrodes, the discrete electrodes arrayed to each create an E-field in an area in a vicinity of the electrode.

3. The system of claim 2, wherein the capacitive relationship comprises:

$$C=[k\epsilon_0 A/d]$$

where C is capacitance, k is a dielectric constant of fluid to be detected, d is a characteristic dimension, $\epsilon_0$ is the permittivity of free space, and A is an electrode surface area.

4. The system of claim 1, wherein the first electrode comprises a first continuous strip electrode or a series of ring electrodes or a series of strip electrodes.

5. The system of claim 4, wherein the first electrode is a substantially uniformly rectangular strip, and the ground plate or second electrode comprise dimensions substantially identical to the first electrode.

6. The system of claim 5, wherein the capacitive relationship comprises:

$$C=[k\epsilon_0 A/d]$$

where C is detected capacitance, k is a dielectric constant of a fluid to be detected, d is a characteristic dimension, $\epsilon_0$ is the permittivity of free space, and A is an electrode surface area.

7. The system of claim 1, wherein the capacitive relationship comprises:

$$C=[k\epsilon_0 A/d]$$

where C is detected capacitance, k is a dielectric constant of a fluid to be detected, d is a distance between the electrodes, $\epsilon_0$ is the permittivity of free space, and A is an electrode surface area.

8. The system of claim 7, wherein inputs to the processor comprise a relationship between fluid quantitative measure, capacitance and a ratio of an area $A_1$ of the first electrode to an area $A_2$ of the second electrode.

9. A sensor system comprising:
a first electrode and a second electrode adapted to create a first electric field within a detection volume;
a pair of reference electrodes adapted to create a second electric field proximate the detection volume;
an electrical field sensor communicatively coupled to the first and second electrodes and to the pair of reference electrodes, the electrical field sensor configured to generate a first signal responsive to a change in the first electric field and a second signal indicative of a change in the second electric field; and
a processor coupled to the electrical field sensor, the processor configured to determine: (i) the dielectric constant of a fluid within the detection volume utilizing the second signal, and (ii) a quantitative measure of the fluid within the detection volume from the first signal in accordance with the dielectric constant and a predetermined relationship between the fluid quantitative measure and a ratio of an area $A_1$ of the first electrode to an area $A_2$ of the second electrode.

10. The system of claim 9, wherein the pair of reference electrodes is disposed such that the horizontal center of the pair of reference electrodes is positioned beneath the horizontal center of the first electrode.

11. The system of claim 9, wherein the pair of reference electrodes is located to sense fluid continuously while the system is in use.

12. The system of claim 9, wherein the first electrode comprises a triangular strip and the second electrode comprises a complementary triangular strip, such that summing equal length complementary segments provides a constant area.

13. An electric filed sensor system for detecting proximity to the vertical drum of a laundry machine, the system comprising:
a grid of electrodes in a plane parallel to a base of the drum adapted to create an electric field within a detection volume comprising the drum, the electrodes aligned spatially from a portion of an outer surface of the drum in the electric field;
an electrical field sensor communicatively coupled to the electrodes, the electrical field sensor configured to generate a signal responsive to a change in the electric field; and
a processor coupled to the electrical field sensor, the processor configured to determine a displacement measure of the drum within the detection volume from the signal in accordance with a predetermined capacitive relationship between the electrodes, the detection volume, and the drum;
wherein the capacitive relationship comprises:

$$C=[k\epsilon_0 A/d]$$

where C is detected capacitance, k is a dielectric constant of an object to be detected, $\epsilon_0$ is the permittivity of free space, and A is an electrode surface area, and d is a characteristic displacement dimension.

14. An electric field sensor system for detecting the proximity of a horizontal drum of a front loading laundry machine, the system comprising:
an array of electrodes aligned in a plane parallel to an axis of rotation of the drum and adapted to create an electric field within a detection volume comprising the drum, the electrodes aligned spatially from a portion of an outer surface of the drum in the electric field;
an electrical field sensor communicatively coupled to the electrodes, the electrical field sensor configured to generate a signal responsive to a change in the electric field; and
a processor coupled to the electrical field sensor, the processor configured to determine a displacement measure of the drum within the detection volume from the signal in accordance with a predetermined capacitive relationship between the electrodes, the detection volume, and the drum;
wherein the capacitive relationship comprises:

$$C=[k\epsilon_0 A/d]$$

where C is detected capacitance, k is a dielectric constant of an object to be detected, $\epsilon_0$ is the permittivity of free space, and A is an electrode surface area, and d is a characteristic displacement dimension.

* * * * *